(12) United States Patent
Kar et al.

(10) Patent No.: US 11,084,100 B2
(45) Date of Patent: Aug. 10, 2021

(54) LASER-ASSISTED MANUFACTURING SYSTEM AND ASSOCIATED METHOD OF USE

(71) Applicant: University of Central Florida Research Foundation, Inc., Orlando, FL (US)

(72) Inventors: Aravinda Kar, Orlando, FL (US); Ranganathan Kumar, Orlando, FL (US); Eduardo Castillo Orozco, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 244 days.

(21) Appl. No.: 16/110,668

(22) Filed: Aug. 23, 2018

(65) Prior Publication Data
US 2019/0061000 A1  Feb. 28, 2019

Related U.S. Application Data

(60) Provisional application No. 62/581,434, filed on Nov. 3, 2017, provisional application No. 62/549,176, filed on Aug. 23, 2017.

(51) Int. Cl.
*B29C 64/00* (2017.01)
*B22F 12/00* (2021.01)
(Continued)

(52) U.S. Cl.
CPC .............. *B22F 12/00* (2021.01); *B05B 5/025* (2013.01); *B22F 1/0018* (2013.01); *B29C 64/00* (2017.08);
(Continued)

(58) Field of Classification Search
CPC ............ B22F 3/1055; B22F 2003/1056; B22F 1/0018; B29C 64/00; H01L 31/06;
(Continued)

(56) References Cited

U.S. PATENT DOCUMENTS 7,306,823 B2 * 12/2007 Sager .................... B22F 1/0018
257/E31.007
2007/0278103 A1 * 12/2007 Hoerr ....................... G02C 7/04
205/80

(Continued)

OTHER PUBLICATIONS

Khan et al., Direct patterning and electrospray deposition through EHD for fabrication of printed thin film transistors. Current Applied Physics. 2011. vol. 11: S271-S279.

(Continued)

*Primary Examiner* — Nahida Sultana
(74) *Attorney, Agent, or Firm* — Molly L. Sauter; Smith & Hopen, P.A.

(57) ABSTRACT

A laser-assisted microfluidics manufacturing process has been developed for the fabrication of additively manufactured structures. Roll-to-roll manufacturing is enhanced by the use of a laser-assisted electrospray printhead positioned above the flexible substrate. The laser electrospray printhead sprays microdroplets containing nanoparticles onto the substrate to form both thin-film and structural layers. As the substrate moves, the nanoparticles are sintered using a laser beam directed by the laser electrospray printhead onto the substrate.

13 Claims, 9 Drawing Sheets

(51) Int. Cl.

| | |
|---|---|
| *B33Y 10/00* | (2015.01) |
| *B33Y 30/00* | (2015.01) |
| *B05B 5/025* | (2006.01) |
| *B33Y 70/00* | (2020.01) |
| *H01L 31/0352* | (2006.01) |
| *H01L 31/0312* | (2006.01) |
| *H01L 31/0745* | (2012.01) |
| *H01L 31/18* | (2006.01) |
| *H01L 31/06* | (2012.01) |
| *B22F 1/00* | (2006.01) |
| *H01L 31/075* | (2012.01) |
| *B05D 1/04* | (2006.01) |
| *B05D 3/06* | (2006.01) |
| *C03B 19/01* | (2006.01) |
| *C03B 19/06* | (2006.01) |
| *B22F 10/10* | (2021.01) |

(52) U.S. Cl.
CPC ............... *B33Y 10/00* (2014.12); *B33Y 30/00* (2014.12); *B33Y 70/00* (2014.12); *H01L 31/0312* (2013.01); *H01L 31/035218* (2013.01); *H01L 31/035254* (2013.01); *H01L 31/06* (2013.01); *H01L 31/075* (2013.01); *H01L 31/0745* (2013.01); *H01L 31/1812* (2013.01); *B05D 1/04* (2013.01); *B05D 3/06* (2013.01); *B22F 10/10* (2021.01); *C03B 19/01* (2013.01); *C03B 19/06* (2013.01)

(58) Field of Classification Search
CPC .......... H01L 31/075; H01L 31/035254; H01L 31/035218; H01L 31/0312; H01L 31/0745; H01L 31/1812; B33Y 10/00; B33Y 30/00; B33Y 70/00; B05B 5/025; C03B 19/06; C03B 19/01; B05D 1/04; B05D 3/06; Y02E 10/548; Y02P 10/25
See application file for complete search history.

(56) References Cited

U.S. PATENT DOCUMENTS

| | | | |
|---|---|---|---|
| 2010/0155496 A1* | 6/2010 | Stark | H05K 3/1241 239/3 |
| 2015/0158051 A1* | 6/2015 | Hoerr | A61L 27/34 427/2.1 |
| 2015/0165553 A1* | 6/2015 | Gaebelein | B29D 30/0606 219/121.84 |
| 2015/0251213 A1* | 9/2015 | Birmingham | B05D 1/007 427/475 |
| 2017/0151578 A1* | 6/2017 | Morad | B05B 5/0255 |
| 2017/0190113 A1* | 7/2017 | Calefati | B33Y 30/00 |
| 2017/0355131 A1* | 12/2017 | Wei | B33Y 50/02 |
| 2018/0085826 A1* | 3/2018 | Luo | B23K 26/14 |
| 2019/0143449 A1* | 5/2019 | Zenou | B41J 2/04 219/76.1 |
| 2020/0215307 A1* | 7/2020 | Maguire | B05B 5/165 |

OTHER PUBLICATIONS

Yeo et al., Flexible supercapacitor fabrication by room temperature rapid laser processing of rol-to-roll printed metal nanoparticle ink for wearable electronics application. Journal of Power Sources. 2014. vol. 246: 562-568.

Shah et al., High temperature spectral selective coatings for solar thermal systems by laser sintering. Solar energy Materials & Solar Cells. 2015. vol. 134: 209-214.

Park and Kim, Excimer laser sintering of indium tin oxide nanoparticles for fabricating thin fits of variable thickness of flexible substrates. Thin Solid Films. 2015. vol. 578: 76-82.

\* cited by examiner

LASER-ASSISTED MANUFACTURING SYSTEM AND ASSOCIATED METHOD OF USE

CROSS-REFERENCE TO RELATED APPLICATIONS

This application claims priority to U.S. Provisional Patent Application No. 62/549,176, entitled "LASER-ASSISTED MICROFLUIDICS MANUFACTURING PROCESS," filed Aug. 23, 2017 and U.S. Provisional Patent Application No. 62/581,434 entitled "LASER-ASSISTED MANUFACTURING PROCESS USING MICROFLUIDIC SUSPENSIONS AND DRY POWDERS," filed Nov. 3, 2017, the entirety of which are incorporated herein by reference.

GOVERNMENT SUPPORT CLAUSE

This invention was made with government support under Grant Number 1563448 awarded by National Science Foundation. The government has certain rights in the invention.

BACKGROUND OF THE INVENTION

The ability to create thin films, in addition to 2-D and 3-D structural arrays of functional materials, addresses a technological need for many applications, including: flexible electronics, bio-sensing, optical coatings, energy conversion/harvesting, and data storage. Accordingly, high-resolution, scalable techniques that can achieve mass production of printed patterns using a variety of functional inks are currently needed in the art.

Microfluidic manufacturing process are known in the art for the fabrication of additively, manufactured structures, such as Intermediate-Band Solar Cells (IBSCs). IBSCs incorporate an intermediate energy band that is partially filled with electrons within the forbidden bandgap of a semiconductor and are designed to provide a large photo-generated current, while maintaining a high output voltage. Photons having insufficient energy to advance electrons from the valence band to the conduction band use the intermediate energy band to generate an electron-hole pair. Nanostructured materials and microfluidic manufacturing processes have been employed in the practical implementation of intermediate-band devices, although manufacturing challenges remain.

Accordingly, what is needed in the art is an improved system and method for additive manufacturing that overcomes the challenges of the fabrication of new architecture

SUMMARY OF INVENTION

The present invention provides a laser-assisted microfluidics manufacturing system and method for the fabrication of additively manufactured structures, e.g., optoelectronic devices, intermediate band solar cells (IBSC), etc.

The inventive concept can be used for scalable large structures using roll-to-roll manufacturing. In the inventive system, the cylinders (feed spool and take-up spool) move or roll the flexible substrate through an electrospray module, which is placed above the flexible substrate. The electrospray module sprays microdroplets containing nanoparticles onto the substrate through both hydrodynamic and electrodynamic shear. As the substrate moves, the nanoparticles are sintered using a laser beam, and fused onto the substrate one layer at a time. The same concept can also be used for depositing regular arrays of microdots and nanodots.

In one embodiment, the present invention provides a method for laser-assisted manufacturing. The method includes, forming one or more sintered thin film layers on a substrate using an electrospray printhead operating in a cone-jet spray mode and forming one or more sintered structural layers adjacent to the one or more sintered thin film nanoparticle layers using the electrospray printhead operating in a micro-dripping mode.

The sintered thin film layers and the sintered structural layers are formed from a suspension selected from a microparticle suspension, a nanoparticle suspension, a biological tissues suspension, a microparticle powder, a nanoparticle powder and a biological tissue powder. Additionally, the sintered structural layers may be 2-dimensional or 3-dimensional layers.

Forming one or more sintered thin film layers on a substrate using an electrospray printhead operating in a cone-jet spray mode may further include, spraying a suspension from the electrospray printhead while simultaneously moving the substrate in a longitudinal direction relative to the electrospray printhead, thereby forming a thin layer of the material on the substrate and then laser sintering the material sprayed onto the substrate using a sintering laser beam.

Forming one or more sintered structural layers adjacent to the one or more sintered thin film layers using the electrospray printhead operating in a micro-dripping mode may further include, ejecting droplets of material from the electrospray printhead, focusing a laser beam onto a focal region above a deposition surface using a reflective surface of the electrospray printhead, wherein the focal region has a long depth of focus, heating the droplets with the laser beam in the focal region to form a paste of the material and depositing the paste of the material onto the deposition surface.

In an additional embodiment, a laser-assisted electrospray printhead is provided which includes, a printhead body comprising a reflective surface, an electrospray holder positioned within the printhead body and extending from the reflective surface forming an electrospray exit and a capillary tube comprising a cone-shaped meniscus at a first end, the capillary tube positioned within the electrospray holder.

In one embodiment, the capillary tube may be coupled to an electrically positive terminal of a power supply and a ring electrode positioned within the electrospray holder may be coupled to an electrically negative or ground terminal of the power supply.

In one embodiment, the reflective surface of the printhead is a parabolic mirror and in another embodiment, the reflective surface is a flat mirror In another embodiment, the present invention provides a laser-assisted electrospray system which includes, a movable substrate, a laser system, a source of material and a printhead coupled to the source of material, wherein the printhead includes a printhead body comprising a reflective surface, an electrospray holder positioned within the printhead body and extending from the reflective surface forming an electrospray exit and a capillary tube comprising a cone-shaped meniscus at a first end, the capillary tube positioned within the electrospray holder.

In the laser-assisted electrospray system of the present invention, the electrospray printhead is operated in a cone-jet spray mode to form one or more sintered thin film layers of the material and the electrospray printhead is operated in a micro-dripping mode to form one or more sintered structural layers adjacent to the one or more sintered thin film nanoparticle layers of the material.

As such, the present invention allows for the fabrication of new architecture devices and lowers the manufacturing cost by utilizing a roll-to-roll process and a novel laser electrospray printhead.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

In various embodiments, the present invention provides a novel additive manufacturing technique that overcomes the challenges of the fabrication of various devices. In one embodiment, a new generation photovoltaic (PV) cell that may be fabricated using the laser-assisted manufacturing process of the present invention is an intermediate band solar cell (MSC).

Figure 1:
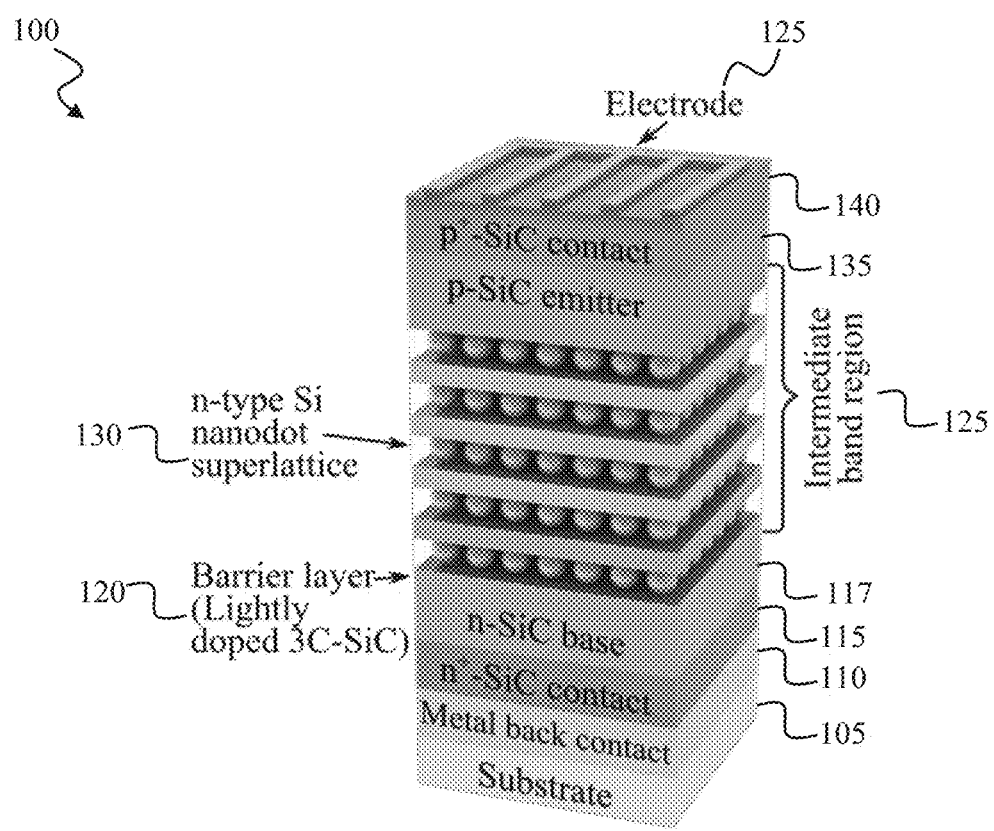
FIG. 1 illustrates an exemplary intermediate band solar cell (IBSC) device that can be manufactured with the laser-assisted microfluidics manufacturing process of the present invention.

FIG. 1 illustrates an exemplary embodiment of a new architecture of an IBSC 100, wherein each layer of the cell is fabricated one at a time by the deposition of nanoparticles through electrospray technology followed by sintering using a laser beam. As shown in FIG. 1, the MSC 100 includes various thin film layers fabricated on a substrate 105 having a metal back contact 110. The thin film layers include an n$^+$-SiC (silicon carbide) contact layer 110, an n-SiC base layer 117 and a barrier layer 120. As described in detail below, the thin film layers are fabricated by operating a laser-assisted printhead in a steady cone-jet spray mode. An intermediate band region 125 is then formed on top of the plurality of thin film layers. The intermediate band region 125 includes and n-type Si nanodot superlattice 130 comprising layers of nanodots arrays separated by a thin film. As described in detail below, the nanodots are fabricated by operating a laser-assisted printhead in a micro-dripping mode. Following the deposition of the intermediate band region 125, a thin film p-SiC emitter 135, a p$^+$-SiC contact 140 and an electrode 150 are subsequently deposited to complete the IBSC.

In various embodiment, the nanoparticles (e.g. 3C—SiC) can be deposited as thin films at low temperatures on glass as well as flexible substrates, such as polyimide (Kapton) plastics, because of the large diffusion coefficient and low melting temperature of the nanoparticles in comparison to that of the corresponding bulk material. The same concept can also be used for deposition of structural arrays, thereby allowing for the fabrication of the intermediate band region of the MSC. The superlattice can be formed by placing Si nanodots 130 and each layer of nanodots can be covered with a 3C—SiC barrier layer 120, as shown in the solar cell of FIG. 1.

The fabrication procedure of the new architecture devices, such as IBSCs, can be described in two major steps. The first step involves the fabrication of thin films. In this step, solid layers are obtained through the thin-film deposition of nanoparticles, wherein a steady cone-jet spray mode of the electrospray module is utilized to accomplish electrospraying of liquid carrying nanoparticles, followed by the subsequent laser sintering of the nanoparticles. In various embodiments, the liquid carrying nanoparticles include nanoparticle suspensions as precursors.

In general, during the fabrication of the thin films, thin wet layers of colloidal precursor (nanoink), comprising an aqueous suspension of nanoparticles, are formed on the substrate by the above-mentioned electrospray technique and each of the thin wet layers are subsequently heated with a laser beam to achieve nanoscale sintering.

Figure 2:
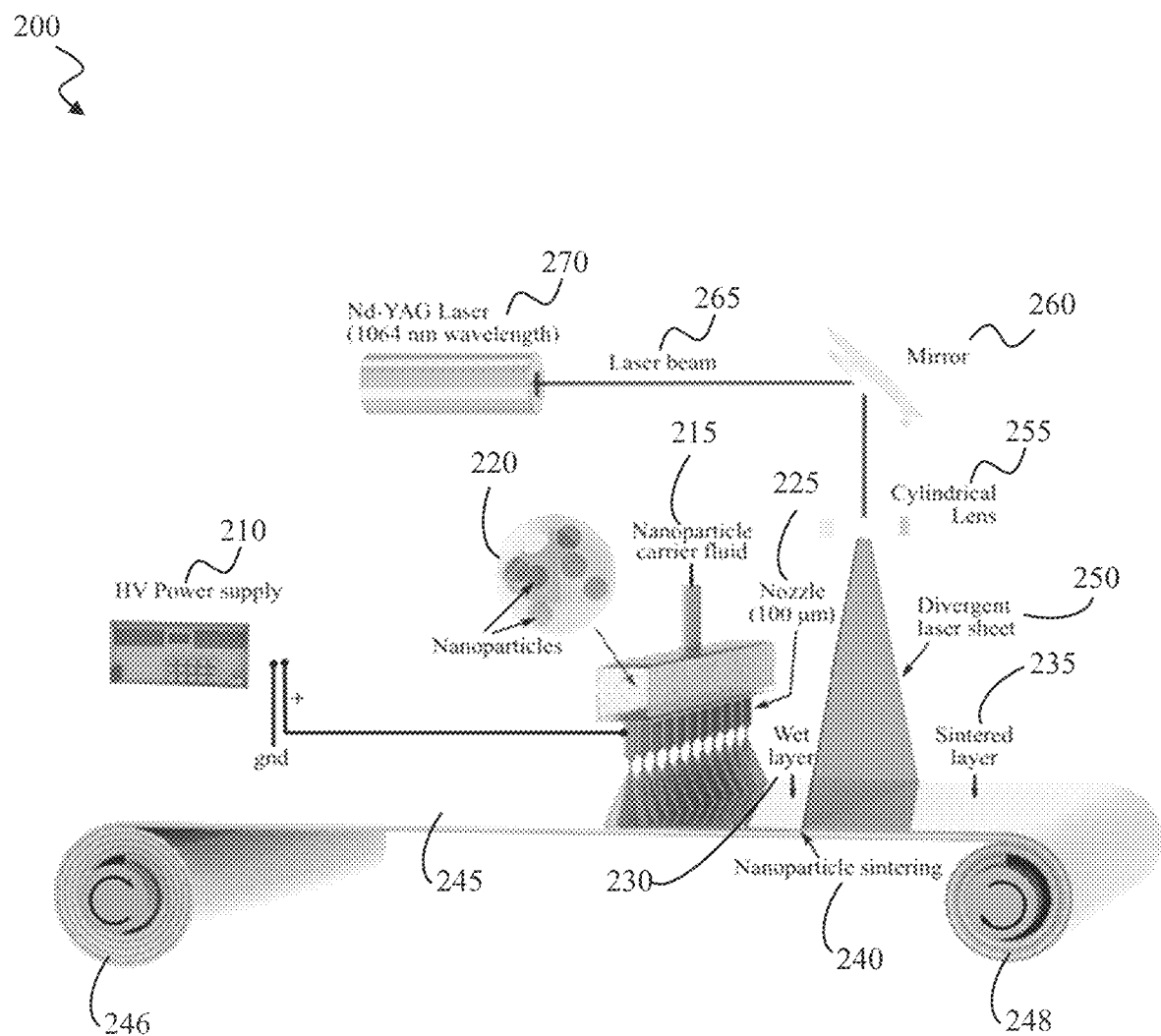
FIG. 2 illustrates an integrated manufacturing process of thin films, wherein a wet layer of nanoink is deposited on the substrate by electrospray operated in steady cone-jet spray mode and sintered by a laser sheet, in accordance with an embodiment of the present invention.

FIG. 2 illustrates an exemplary schematic of the manufacturing process 200 for the production of thin films (e.g., layer deposition of each of the thin layers of the MSC solar cell 100, such as the n-type 110, 115 and p-type 135, 140 3C—SiC nanoparticles, as shown in FIG. 1). As shown, to produce a wet thin film, the electrospray printhead 205 is placed above the moving substrate 245. More specifically, a nanoparticle suspension 220 is provided as a nanoparticle carrier fluid 215 to the electrospray module 205. The electrospray module 205 is coupled to a power supply 210 to establish an electrospray utilizing electricity to disperse a liquid or a fine aerosol. Using a plurality of nozzles 225 of the electrospray module 205, a wet layer 230 is first deposited on the substrate 245 by the electrospray module 205 operated in steady cone-jet spray mode as the substrate 245 moves in the longitudinal direction, using a feed spool 246 and take-up spool 248, at a constant speed, thereby allowing the process to be adapted to roll-to-roll manufacturing. The wet layer 230 is then dried by laser heating to form the sintered layer 235. Rapid heating and rapid cooling inherent in laser processing enable heating only a thin layer of materials at the substrate surface without melting the substrate. This heat transfer mechanism makes the proposed laser technology advantageous over other deposition techniques, especially for manufacturing solar cells on plastic substrates. The dry nanoparticles are then sintered and recrystallized through a laser heat treatment.

As shown in FIG. 2, each wet film 230 is vaporized and the particles are subsequently sintered by laser heating to form the functional film, prior to depositing the next layer. A laser beam 265 from a laser source 270 is directed through a cylindrical lens 255 using a mirror to establish a divergent laser sheet 250 incident upon the substrate 245. The sintering laser beam is shaped into a divergent laser sheet 250, to achieve a rectangular heat source on the substrate surface 245 so that the entire width of the substrate 245 can be sintered to obtain a continuous film. In this exemplary embodiment, the electrosprays 205 are fed with nanoink comprising a nanoparticle suspension in deionized water.

The second step in the manufacturing of the new architecture devices involves the fabrication of structural arrays. In this step, the structural arrays are obtained through the discrete deposition of microdroplets and nanodroplets using the electrospray module operating in a micro-dripping mode, in addition to using the thin jet produced in the steady cone-jet spray mode. The resulting structural array is then sintered by the laser beam, thereby allowing the fabrication of microdot and nanodot superlattice structures.

Figure 3:
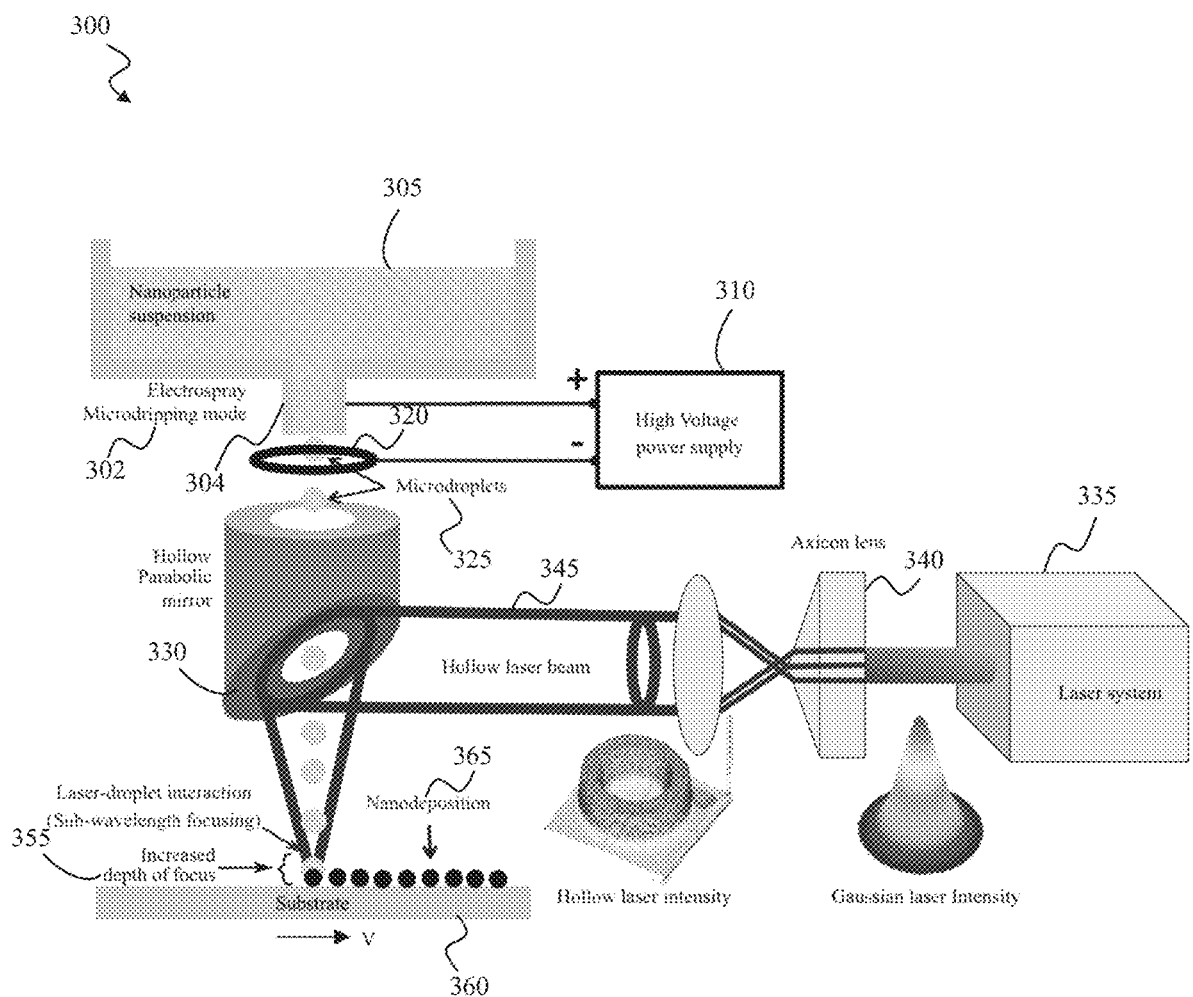
FIG. 3 illustrates an integrated manufacturing process for discrete deposition of microdots and nanodots using the electrospray module operating in a micro-dripping mode in addition to using the thin jet produced in the steady cone-jet spray mode when a hollow parabolic mirror is used to focus an annular laser beam.

FIG. 3 illustrates an integrated manufacturing process 300 for discrete deposition of microdots and nanodots using the electrospray module operating in a micro-dripping mode 302. In the micro-dripping mode, only fragments of liquid (microdroplets) 325 from the nanoparticle suspension 305 are ejected from the capillary tube 304 by deformation and detaching of the liquid meniscus and the steady cone-jet spray mode contains a thin jet portion which is used for discrete deposition. A high voltage power supply 310 coupled to the capillary tube 304 and an electrode ring 320 of the electrospray printhead is used to form the microdroplets 325 from the nanoparticle suspension 305. The nanodot array 365 is subsequently heated with a laser beam to adhere the nanodots to the solid layers on the substrate 360. In this manner, several structural array layers can be deposited to complete the fabrication process.

The system shown in FIG. 3 employs an axicon lens 340 to convert the incoming Gaussian beam from the laser system 335 into an annular laser beam 345. In this embodiment, a hollow parabolic mirror 330 of the electrospray printhead is used to focus the annular laser beam into a focal region having a long depth of focus 355 just above the surface of a substrate 360. At this long focal region 355, the liquid droplets, which are suspensions of micro-particles and nanoparticles, remain for a longer period of time under the laser heating conditions. The suspensions can also contain various elements such as Fe, Cr and Ni, alloys such as steel, brass and superalloy, amorphous materials such as glass and metallic glass, and crystal line materials such as Si, Ge, SiC and GaN crystals. The laser heating in the long focal region 355 evaporates the liquid component of the droplet and causes the nanoparticles or other solid components in the droplet suspension to reach temperatures close to their melting (approximately 95% of the melting temperature) or softening temperature. A paste-like soft matter emerges from the long focal region 355 like tooth paste and deposits on the substrate 360 to form two-dimensional or three-dimensional structures, as in additive manufacturing. The paste-like soft matter can also be deposited on the substrate as isolated dots to form an array of dots.

In a specific application for bio-printing, the nanoparticle suspension can be replaced with a suspension of biological tissues to produce two-dimensional and three-dimensional structures including biosensor, bioactuator, regenerative medicine, and the seeding and impregnation of cells for homogeneous or heterogeneous tissue engineering.

Figure 4:
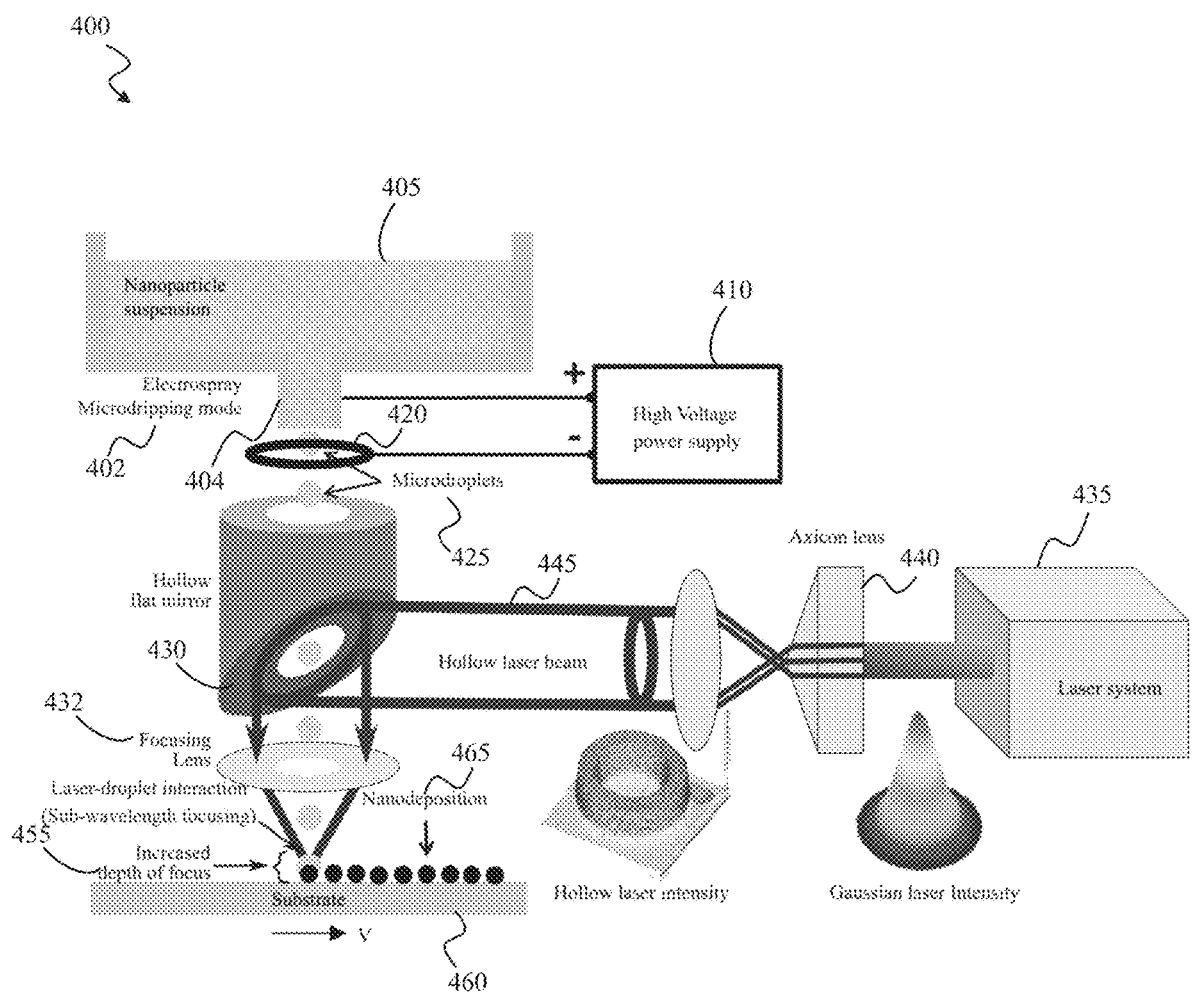
FIG. 4 illustrates an integrated manufacturing process for discrete deposition of microdots and nanodots using the electrospray module operating in a micro-dripping mode in addition to using the thin jet produced in the steady cone-jet spray mode when a hollow flat mirror and an annular lens are used to focus an annular laser beam.

With reference to FIG. 4, in another configuration of the manufacturing process for micro-dot and nano-dot arrays, the above-mentioned hollow parabolic mirror is replaced with an annular flat mirror 430 and an annular lens 432. The annular flat mirror 430 turns the horizontal hollow beam into a vertical hollow beam 445, and the annular lens 432 focuses the vertical hollow beam into a focal region having long depth of focus 455 just above the surface of a substrate 460. The converging laser beam interferes in the focal region 455 and forms a diffraction-free beam known as the Bessel beam. This Bessel beam can have a smaller diameter than the original Gaussian beam that is produced by the laser system 435 and converted into the annular laser beam 445. In this embodiment, the manufacturing process 400 for discrete deposition of microdots and nanodots utilizes the electrospray module operating in a micro-dripping mode 402. In the micro-dripping mode, only fragments of liquid (microdroplets) 425 from the nanoparticle suspension 405 are ejected from the capillary tube 404 by deformation and detaching of the liquid meniscus and the steady cone-jet spray mode contains a thin jet portion which is used for discrete deposition. A high voltage power supply 410 coupled to the capillary tube 404 and an electrode ring 420 of the electrospray printhead is used to form the microdroplets 425 from the nanoparticle suspension 405. The nanodot array 465 is subsequently heated with a laser beam to adhere the nanodots to the solid layers on the substrate 460. In this manner, several structural array layers can be deposited to complete the fabrication process. The suspensions can also contain various elements such as Fe, Cr and Ni, alloys such as steel, brass and superalloy, amorphous materials such as glass and metallic glass, and crystalline materials such as Si, Ge, SiC and GaN crystals. The laser heating in the long focal region 455 evaporates the liquid component of the droplet 425 and causes the nanoparticles or other solid components in the droplet suspension to reach temperatures close to their melting (approximately 95% of the melting temperature) or softening temperature. A paste-like soft matter emerges from the long focal region 455 like tooth paste and deposits on the substrate 460 to form two-dimensional or three-dimensional structures as in additive manufacturing. The paste-like soft matter can also be deposited on the substrate 460 as isolated dots to form an array of dots.

Additionally, in this embodiment for bio-printing applications, the nano-particle suspension can be replaced with a suspension of biological tissues to produce two-dimensional and three-dimensional structures including biosensor, bioactuator, regenerative medicine, and the seeding and impregnation of cells for homogeneous or heterogeneous tissue engineering.

During the basic steps of the fabrication of the structural arrays of the present invention utilizing a nanoparticle suspension, fragments of the liquid nanoink are ejected from the tip of the capillary tube by deformation and detaching of the electrified liquid meniscus. A wet point is then deposited on top of the substrate by the impingement of the liquid nanoink (microdroplets and nanodroplets) and the wet point is dried using laser heating. The dry nanoparticles are then sintered and recrystallized by a laser heat treatment. The substrate then moves in the longitudinal direction to permit deposition at another point on the substrate. Multilayer deposition of the structural array can be achieved by heating the droplets with the laser beam to adhere them to the previous layer. In this manner, several layers can be deposited to complete the fabrication process.

Figure 5:
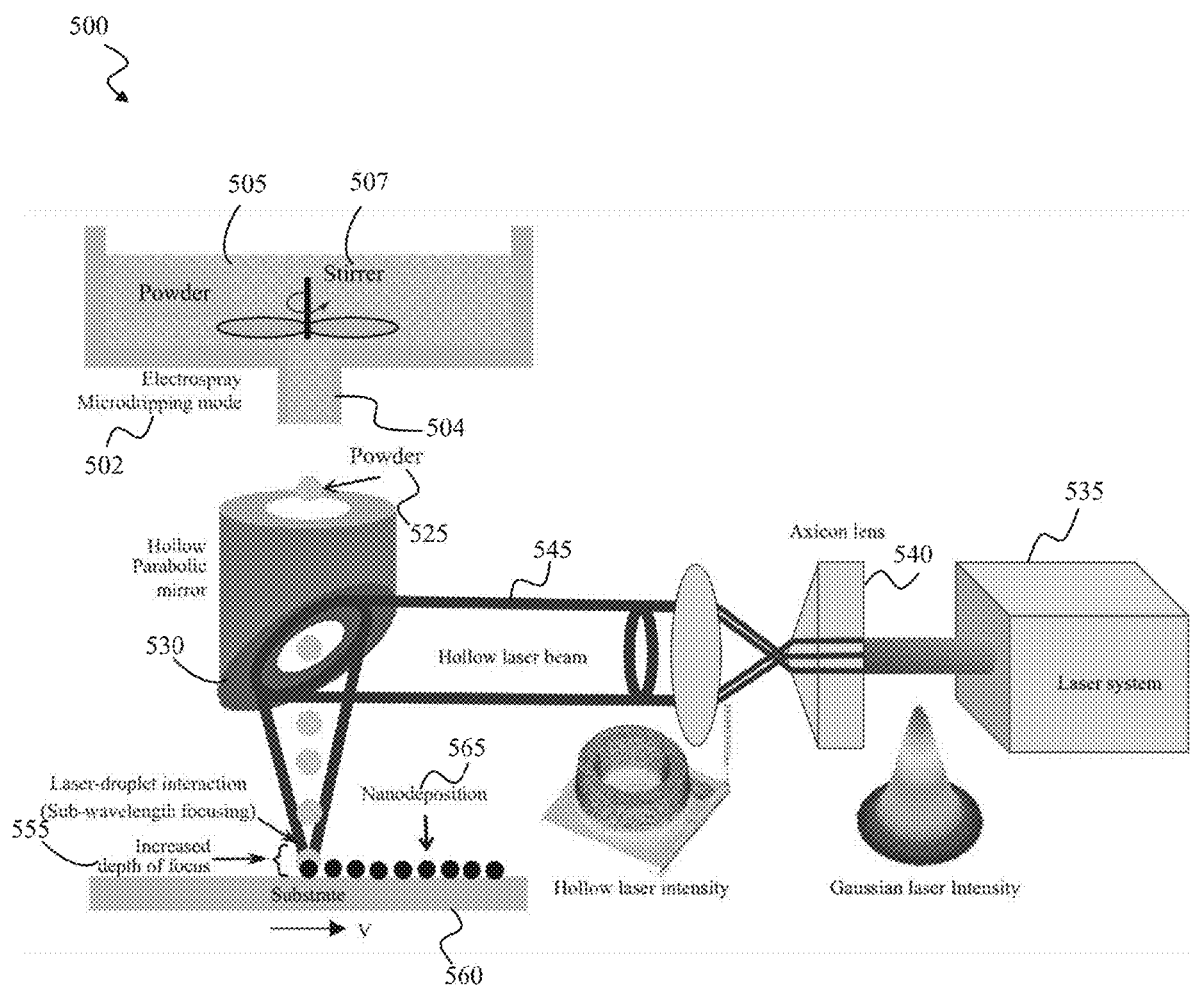
FIG. 5 illustrates an integrated manufacturing process for deposition of dry powders. A hollow parabolic mirror is used to focus the annular laser beam.

As shown in FIG. 5, in another embodiment of this invention, the nanoparticle suspension tank of FIG. 3, in the integrated manufacturing process 500, can be replaced with a dispenser 505 containing powders (1 to 250 micrometer size) of various elements such as Fe, Cr and Ni, alloys such as steel, brass and superalloy, amorphous materials such as glass and metallic glass, and crystalline materials such as Si, Ge, SiC and GaN crystals. The dispenser 505 can also contain a stirrer 507 that drives the powder 525 downward to a vertical tube 504. The powder falls through the tube 504 by gravity, passes through the hollow region of the parabolic mirror 530, and eventually enters into the long focal region 555 of the laser beam. The laser system 535 provides a Guassian laser that is converted to a hollow laser beam 545 by an axicon lens 540. The parabolic mirror 530 of the electrospray printhead directs the hollow laser beam to form the long focal region 555 of the laser beam. When operating the electrospray printhead in the electrospray micro-dripping mode 502, the laser beam in the long focal region 555 heats the powder particles very close to their melting (approximately 95% of the melting temperature) or softening temperature. A paste-like soft matter emerges from the long focal region 555 like tooth paste and deposits a nanodeposition 565 on the substrate 560 to form two-dimensional or three-dimensional structures, as in additive manufacturing. The paste-like soft matter can also be deposited on the substrate as isolated dots to form an array of dots.

Figure 6:
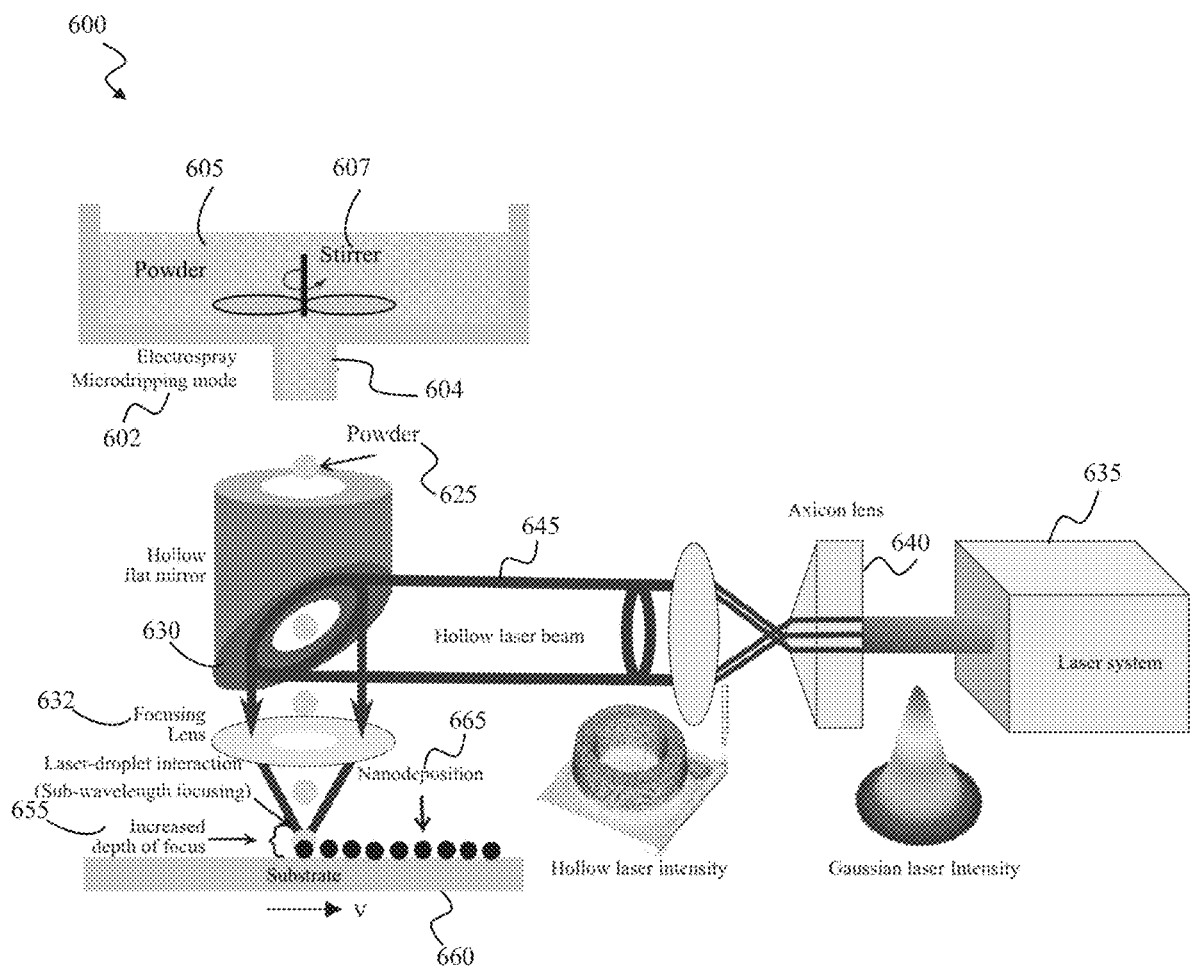
FIG. 6 illustrates an integrated manufacturing process for deposition of dry powders. A hollow flat mirror and an annular lens are used to focus the annular laser beam.

In an additional embodiment, illustrated in FIG. 6, the integrated manufacturing process 600 includes a dispenser 605 containing powders (1 to 250 micrometer size) of various elements such as Fe, Cr and Ni, alloys such as steel, brass and superalloy, amorphous materials such as glass and metallic glass, and crystalline materials such as Si, Ge, Sit; and GaN crystals. The dispenser 605 can also contain a stirrer 607 that drives the powder 625 downward to a vertical tube 604. The powder falls through the tube 604 by gravity, passes through the hollow region of the parabolic mirror 630, and eventually enters into the long focal region 655 of the laser beam. In this embodiment, the laser system 635 provides a Guassian laser that is converted to a hollow laser beam 645 by an axicon lens 640. A hollow flat mirror 630 of the electrospray printhead directs the hollow laser beam to a focusing lens 632 that forms the long focal region 655 of the laser beam. When operating the electrospray printhead in the electrospray micro-dripping mode 602, the laser beam in the long focal region 655 heats the powder particles very close to their melting (approximately 95% of the melting temperature) or softening temperature. A paste-like soft matter emerges from the long focal region 655 like tooth paste and deposits a nanodeposition 665 on the substrate 660 to form two-dimensional or three-dimensional structures, as in additive manufacturing. The paste-like soft matter can also be deposited on the substrate as isolated dots to form an array of dots.

In an additional embodiment, the system may include one or more ultrasonic sources coupled to the substrate. The ultrasonic sources transmit ultrasonic beams to the substrate where the nanoparticle droplets, the laser and the substrate interact. The ultrasonic beams, or waves, from the ultrasonic source are effective in vibrating the nanoparticles and dispersing the nanoparticles in a predetermined pattern, depending upon the frequency of the ultrasonic waves, the repetition rates of the ultrasonic beam and the energy of the ultrasonic beam.

In a particular embodiment, the system may include two or more ultrasonic sources that transmit ultrasonic waves to the substrate, wherein the two or more ultrasonic beams. In this embodiment, the ultrasonic beams interfere at the interaction zone to create an interference pattern consisting of spatially alternating regions of high ultrasonic energy followed by low ultrasonic energy. This interference pattern vibrates the nanoparticles and redistributes the nanoparticles in a predetermined pattern, depending on the interference pattern. The total energy in the interference pattern and the spacing between the regions of high and low energies depend on the frequency of the ultrasonic waves, repetition rates of the ultrasonic beams and the energy of each ultrasonic beam.

As described, in the present invention, the electrospray module can be operated in both a steady cone-jet spray mode and in a micro-dripping mode by changing the electric field and the feed rate of the electrospray module. The electric field can be generated by an AC or a DC current source. The present invention additionally provides a new laser electrospray printhead that facilitates the fabrication of structural arrays in the new architecture devices.

Figure 7:
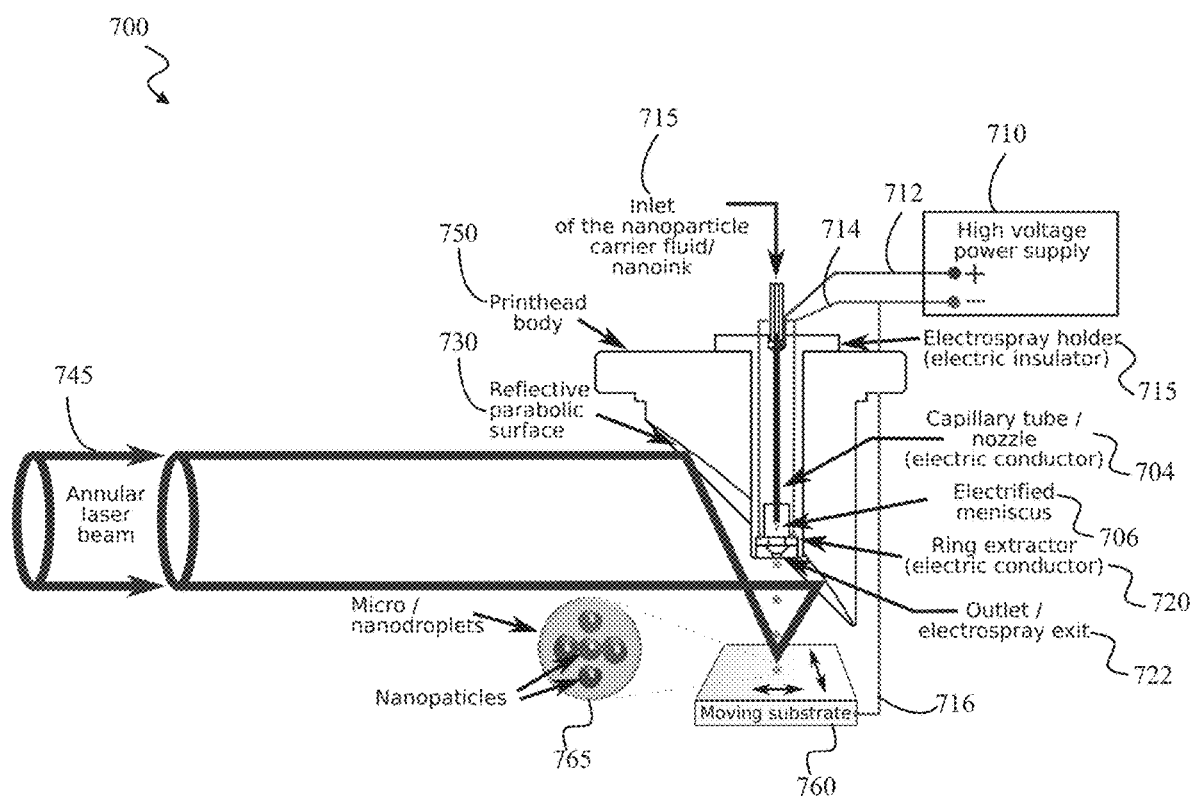
FIG. 7 illustrates a schematic of the manufacturing process of structural arrays, including the operation and functionality of the laser electrospray printhead with a 3-electrode configuration for the deposition of microdots and/or nanodots, in accordance with an embodiment of the present invention.
Figure 8:
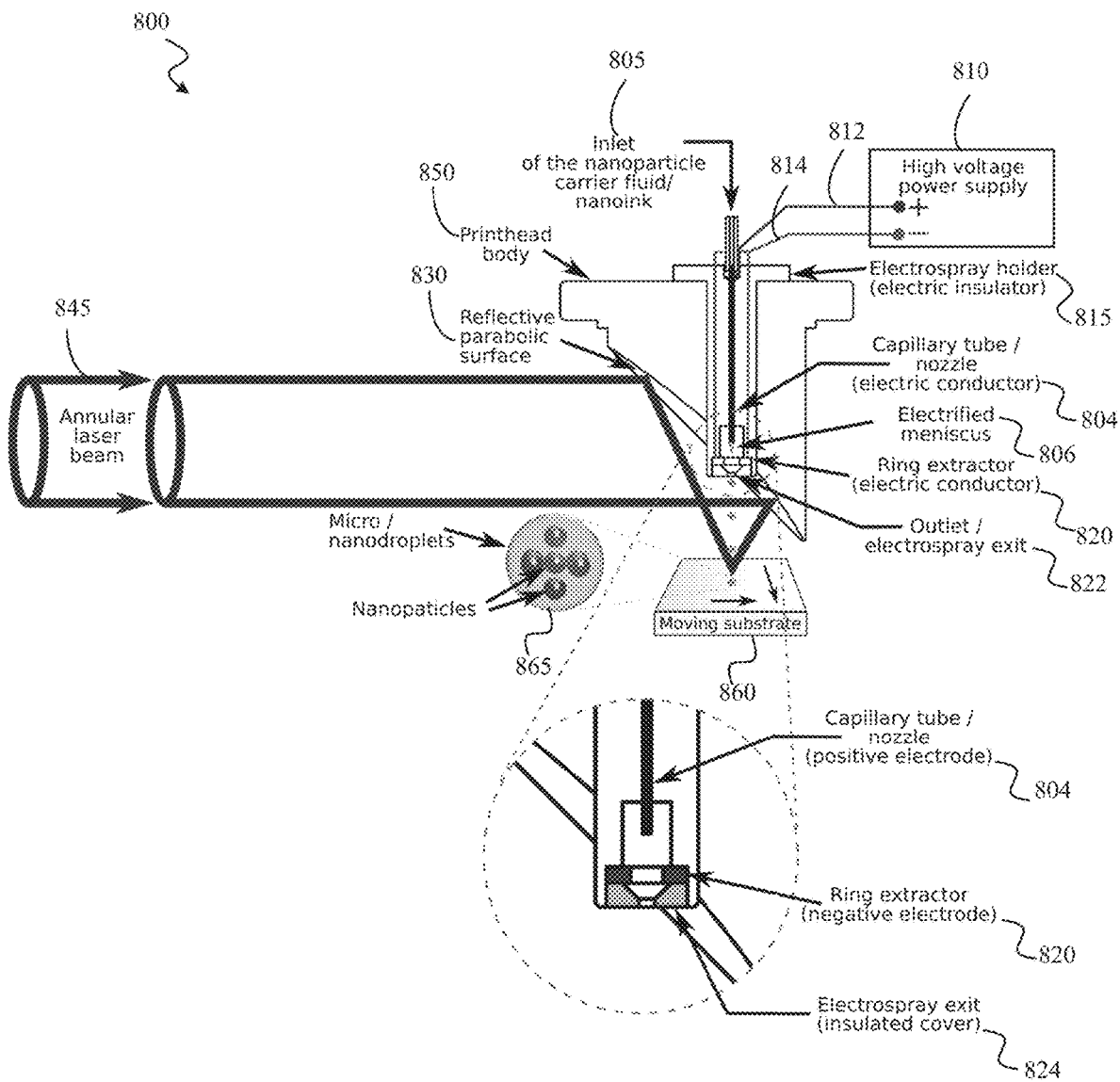
FIG. 8 illustrates a schematic of the manufacturing process of structural arrays, including the operation and functionality of the laser electrospray printhead with a 2-electrode configuration for the deposition of microdots and/or nanodots, in accordance with an embodiment of the present invention.

In various embodiment, the laser-assisted electrospray printhead of the present invention provides a novel solution for additive manufacturing. FIG. 7 and FIG. 8 illustrate the operating principle of the laser-assisted electrospray printhead, in accordance with the present invention, wherein each layer is fabricated one at a time by the deposition of nanoparticles through electrospray technology and subsequently sintered using a laser beam. The nanoparticles can be deposited at discrete points at low temperatures on glass substrates as well as flexible substrates, such as polyimide (Kapton) plastics, because of the large diffusion coefficient and low melting temperature of nanoparticles compared to the corresponding bulk material. Therefore, the proposed nanoparticle-based printhead will lower the overall manufacturing and material costs.

The laser-assisted electrospray process of the present invention can operate in a 3-electrode or a 2-electrode configuration. With reference to FIG. 7, in the 3-electrode system 700, the electric field from the high voltage power supply 710 is applied between the capillary tube 704 and the ring extractor (extractor electrode) 720, as well as between the capillary tube 704 and the substrate (collector electrode) 760. As shown, the capillary tube is electrically coupled 712 to a positive terminal of the power supply 710 to establish an electrified meniscus 706, the ring extractor 720 is electrically coupled 714 to a negative terminal of the power supply 710 and the substrate 760 is electrically coupled 716 to the negative terminal of the power supply 710. A printhead body 710 holds the capillary tube 704 that is positioned within an electrospray holder 715. In operation, the capillary tube 704 receives the nanoparticle carrier fluid at an inlet 705 and dispenses micro/nanodroplets 765 from an outlet 722 onto the moving substrate 760. The reflective parabolic surface 730 of the printhead body 750 then directs the annular laser beam 745 into a long focal region above the surface of the substrate 760 to establish the structural array on the substrate 760.

With reference to FIG. 8, in the 2-electrode system 800, the electric field from the high voltage power supply 810 is applied between the capillary tube 804 and the ring extractor (extractor electrode) 820, however in this embodiment, the bottom part of the ring extractor 820 is protected with an insulative cover 824 at the electrospray exit 822. The electrospray exit insulative cover 824 is made of an insulator material to prevent the return of the micro- and nano-droplets 865 to the ring extractor 820, since the electrically charged droplet can get attached to this electrode due to the action of the electric field, As shown, the capillary tube is electrically coupled 812 to a positive terminal of the power supply 810 to establish an electrified meniscus 806 and the ring extractor 820 is electrically coupled 814 to a negative terminal of the power supply 810. A printhead body 810 holds the capillary tube 804 that is positioned within an electrospray holder 815. In operation, the capillary tube 804 receives the nanoparticle carrier fluid at an inlet 805 and dispenses micro/nanodroplets 865 from an outlet 822 onto the moving substrate 860. The reflective parabolic surface 830 of the printhead body 850 then directs the annular laser beam 845 into a long focal region above the surface of the substrate 860 to establish the structural array on the substrate 860.

In the laser-assisted electrospray printhead of the present invention, an electric field is applied between the two internal electrodes (capillary tube and ring extractor) in order to generate microdroplets and/or nanodroplets from the operation of the electrospray in micro-dripping mode and in steady cone-jet spray mode, depending upon the feed rate and the electric field strength through both hydrodynamic and electrodynamic shear. This allows the deposition of the nanoparticle carrier fluid (nanoink) on a moving substrate. Each microdroplet serves dual roles as a nanoparticle carrier to the substrate and as a superlens that focuses the laser beam to a subwavelength diameter. The printhead receives an annular laser beam of nearly uniform radial intensity distribution for the sintering process of the nanoparticles. The invention includes a special parabolic reflective surface (mirror) with a hole, which is used to focus the annular laser beam while microdroplets and/or nanodroplets are injected into the hollow beam. The laser beam is refocused by the microdroplet and nanodroplet superlens and the droplet is heated by the beam, thereby causing the water to evaporate and the nanoparticles to sinter and form microlayers and/or nanolayers on the substrate. Rapid heating and rapid cooling inherent in laser processing enable heating only on a thin layer of material at the substrate surface without melting the substrate. This heat transfer mechanism makes the proposed laser technology advantageous over other deposition techniques, especially for manufacturing solar cells on plastic substrates.

Figure 9:
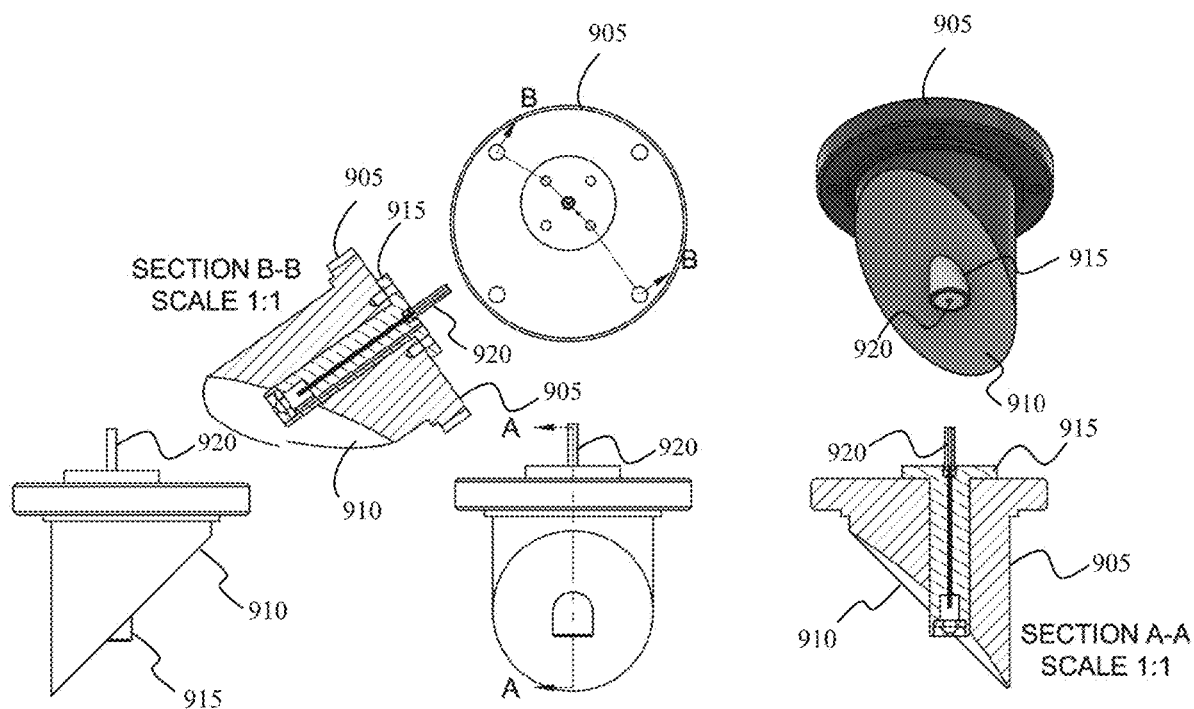
FIG. 9 illustrates the laser electrospray printhead (LEP), including isometric, plane, and section views of the LEP, in accordance with an embodiment of the present invention.

FIG. 9 illustrates the isometric, plane, and section view of the proposed laser electrospray printhead (LEP) As shown in FIG. 9, the main components of the LEP include, a body 905 for containing all the components of the LEP. The body holds a parabolic reflective surface 910 that focuses the incoming laser annular beam and the body 905 has a hole to accommodate the electrospray holder 915. The parabolic reflective surface 910 acts as a mirror that reflects almost all the incoming radiation from the hollow laser beam. The capillary tube 920 is used to transport the nanoparticle carrier fluid (nanoink) from the inlet to ejection point. The capillary tube 920 is connected to a positive terminal, so that the nanoparticle carrier fluid, which is forced through it, can be electrically charged. Note that an electric field is created between the capillary tube 920 and the ring extractor 925, so that a cone-shaped meniscus is present at the end of the capillary tube 920. The ring electrode 925 is either grounded or connected to a negative terminal using either one or more wires or a concentric cylinder to produce a symmetric electric field in the capillary tube 920 so that the electrified micro- and nano-droplets have a vertically straight trajectory until the deposition on the substrate. Once the microdroplets and/or nano-droplets are ejected from the electrified cone-shaped meniscus, they pass through the center of the ring electrode 925 and continue their path until they hit the substrate, where the deposition is taking place. The electrospray holder 915 holds the capillary tube 920 and the ring extractor 925. The electrospray holder 915 is made of an electric insulator to insulate the capillary tube 904 and the ring extractor 925 from the rest of the components. Note that the electrospray can be operated in both micro-dripping and steady cone-jet spray mode by changing the electric field between the capillary tube 920 and the ring extractor 925.

As described, in various embodiments, the present invention provides a novel additive manufacturing technique and novel laser electrospray printhead that overcomes the challenges of the fabrication of new architecture devices, including new generation photovoltaic cells.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described.

What is claimed is:
1. A laser-assisted electrospray printhead comprising:
   a printhead body comprising a reflective surface, the reflective surface positioned to focus a laser beam onto a focal region above a deposition surface; and
   an electrospray holder positioned within the printhead body and extending from the reflective surface forming an electrospray exit.
2. The laser-assisted electrospray printhead of claim 1, further comprising a capillary tube comprising a cone-shaped meniscus at a first end, the capillary tube positioned within the electrospray holder, wherein the capillary tube is coupled to an electrically positive terminal of a power supply.
3. The laser-assisted electrospray printhead of claim 2, further comprising a ring electrode positioned within the electrospray holder and coupled to an electrically negative or ground terminal of the power supply.
4. The laser-assisted electrospray printhead of claim 3, wherein the ring electrode is coupled to the electrically negative or ground terminal by one or more wires.
5. The laser-assisted electrospray printhead of claim 3, wherein the ring electrode is coupled to the electrically negative or ground terminal by a concentric cylinder.
6. The laser-assisted electrospray printhead of claim 1, wherein the reflective surface is selected from a parabolic mirror and a flat mirror.
7. The laser-assisted electrospray printhead of claim 1, further comprising an insulated cover positioned to surround the electrospray exit.
8. A laser-assisted electrospray system comprising:
   a movable substrate;
   a laser system to emit a laser beam;
   a source of material;

a printhead coupled to the source of material, the printhead comprising;
: a printhead body comprising a reflective surface, the reflective surface to focus the laser beam onto a focal region above the movable substrate; and
: an electrospray holder positioned within the printhead body and extending from the reflective surface forming an electrospray exit.

9. The laser-assisted electrospray system of claim 8, further comprising:
: a power supply; and
: a capillary tube comprising a cone-shaped meniscus at a first end, the capillary tube positioned within the electrospray holder and coupled to an electrically positive terminal of the power supply.

10. The laser-assisted electrospray system of claim 8, further comprising:
: a power supply; and
: a ring electrode positioned within the electrospray holder, wherein the ring electrode is coupled to an electrically negative or ground terminal of the power supply.

11. The laser assisted electrospray system of claim 10, further comprising a power supply, wherein the substrate is coupled to an electrically negative or ground terminal of the power supply.

12. The laser-assisted electrospray system of claim 8, further comprising:
: at least one ultrasonic source coupled to the movable substrate, the at least one ultrasonic source to transmit one or more ultrasonic beams to vibrate the movable substrate to disperse the material in a predetermined pattern on the movable substrate.

13. The laser-assisted electrospray system of claim 8, wherein the electrospray printhead is operated in a cone-jet spray mode to form one or more sintered thin film layers of the material; and
: the electrospray printhead is operated in a micro-dripping mode to form one or more sintered structural layers adjacent to the one or more sintered thin film nanoparticle layers of the material.

\* \* \* \* \*